(12) United States Patent
Berhorst et al.

(10) Patent No.: US 7,710,213 B2
(45) Date of Patent: May 4, 2010

(54) METHOD FOR VOLTAGE LIMITATION IN A TRANSPONDER

(75) Inventors: Martin Berhorst, Heilbronn (DE); Alexander Kurz, Schwaebisch Hall (DE); Peter Schneider, Hassmersheim (DE)

(73) Assignee: Atmel Automotive GmbH, Heilbronn (DE)

( * ) Notice: Subject to any disclaimer, the term of this patent is extended or adjusted under 35 U.S.C. 154(b) by 689 days.

(21) Appl. No.: 11/706,403

(22) Filed: Feb. 15, 2007

(65) Prior Publication Data

US 2007/0194928 A1 Aug. 23, 2007

(30) Foreign Application Priority Data

Feb. 15, 2006 (DE) .................. 10 2006 006 912

(51) Int. Cl.
H02M 1/32 (2007.01)
H02M 1/34 (2007.01)
H03B 1/00 (2006.01)
H03K 7/00 (2006.01)

(52) U.S. Cl. .................. 332/106; 332/107; 331/75; 340/10.1; 363/78; 363/84; 363/147

(58) Field of Classification Search .................. 331/63, 331/74–77; 332/106, 107; 340/10.1; 363/13, 363/74, 78, 84, 147

See application file for complete search history.

(56) References Cited

U.S. PATENT DOCUMENTS

| | | |
|---|---|---|
| 5,815,355 A | 9/1998 | Dawes |
| 6,304,613 B1 | 10/2001 | Koller et al. |
| 6,778,070 B1 | 8/2004 | Thomas |
| 7,151,436 B2 | 12/2006 | Fischer et al. |
| 7,319,368 B2 * | 1/2008 | Berhorst et al. .......... 331/117 R |

(Continued)

FOREIGN PATENT DOCUMENTS

DE 103 01 451 A1 7/2004

(Continued)

OTHER PUBLICATIONS

Hao Yu et al: "Circuitry for a wireless microsystem for neural recording microprobes" Proceedings of the 23$^{rd}$ Annual International Conference of the IEEE Engineering in Medicine and Biology Society. 2001 Conference Proceedings. (EMBS). Istanbul, Turkey, Oct. 25-28, 2001, vol. 1 of 4. Conf. 23, Oct. 25, 2001, pp. 761-764, XP010593486 ISBN: 0-7803-7211-5.

*Primary Examiner*—David Mis
(74) *Attorney, Agent, or Firm*—Muncy, Geissler, Olds & Lowe, PLLC

(57) ABSTRACT

A circuit for voltage limitation is provided in a transponder with a resonant circuit, which comprises at least one inductor, a capacitor, a depletion layer component with an input, output, and a control input, a first resonant circuit terminal, which is connected to the input of the depletion layer element, and a second resonant circuit terminal, which is connected to the output of the depletion layer element, whereby there is a connection between the control input of the depletion layer component and the first resonant circuit terminal and the second resonant circuit terminal. A method for voltage limitation in a transponder is provided, whereby for voltage limitation in the transmitting and receiving resonant circuit, the control terminal of the depletion layer element is driven by the voltage of the first and second resonant circuit terminal.

12 Claims, 4 Drawing Sheets

U.S. PATENT DOCUMENTS

2005/0237123 A1  10/2005  Berhorst et al.

FOREIGN PATENT DOCUMENTS

| DE | 10 2004 020 816 A1 | 11/2005 |
| DE | 698 36 260 T2 | 5/2007 |
| DE | 699 33 520 T2 | 6/2007 |
| EP | 0 993 652 B1 | 4/2000 |
| EP | 1589656 | 10/2005 |

* cited by examiner

METHOD FOR VOLTAGE LIMITATION IN A TRANSPONDER

This nonprovisional application claims priority under 35 U.S.C. §119(a) on German Patent Application No. DE 102006006912, which was filed in Germany on Feb. 15, 2006, and which is herein incorporated by reference.

BACKGROUND OF THE INVENTION

1. Field of the Invention

The present invention relates to a method for voltage limitation and to a circuit for voltage limitation in a transponder.

2. Description of the Background Art

Methods and circuits are known to one skilled in RFID (RFID=Radio frequency Identification). RFID is, for example, a transmitting resonant circuit that may supply an inductively coupled receiving resonant circuit with power and reads data via the receiving resonant circuit. Such connections are employed, for instance, for object identification, whereby a transmitting resonant circuit of a reading device (reader) responds to an object marked with a label (tag) via a receiving resonant circuit and retrieves information.

To establish contact, the transmitting resonant circuit of the reading device generates a high-frequency magnetic field, which induces an alternating voltage in an inductor of a receiving resonant circuit located near the reading device. The alternating voltage induced in the receiving resonant circuit is rectified and is used, for instance, to supply power to an integrated circuit connected to the receiving resonant circuit. In addition, a clock frequency, which can be made available to the integrated circuit, for example, to a microprocessor and/or a memory element as the system clock, can also be derived from the induced alternating voltage. By supplementing the inductor of the transmitting resonant circuit and/or receiving resonant circuit with capacitors, particularly with parallel capacitors, for resonant circuits, resonance effects are achieved which considerably improve the efficiency of the power transmission.

A transmission of data from the reading device to the receiving resonant circuit (downlink) can occur, for instance, by turning the magnetic field on and off. For data transfer in the opposite direction from the receiving resonant circuit to the reading device, a load modulation can be used, which requires a sufficient proximity (distance less than 0.16*wavelength) of the transmitting and receiving resonant circuit. With sufficient proximity, transformer coupling occurs in which the power uptake of the receiving coil is revealed by a feedback to the transmitting resonant circuit in voltage changes at the transmitting resonant circuit. Controlled modulations of the load, thus, the impedance of the receiving resonant circuit, cause voltage changes in the transmitting resonant circuit, which can be evaluated for a data transmission.

As the quality of the inductors used in the receiving resonant circuit improves, when the ratio of reactance to effective resistance increases, the attenuation of the resonant circuit and the width of the resonance curve decline. The use of higher quality coils therefore causes greater frequency selectivity and, at the same voltage on the reader side, a higher voltage on the tag side, which broadens the range of the communication connection. At small distances between the reader and tag, depending on the transmitting power, such high voltages can be induced in the tag that an integrated circuit present in the tag can be destroyed.

German Patent Application DE 10 2004 020 816 A1, which corresponds to U.S. Publication No. 20050237123, which is incorporated herein by reference, discloses a reduction or limitation of the voltage at the receiving resonant circuit to specific values, which is described hereafter as the first clamping voltage. Furthermore, within the framework of the load modulation, switching is undertaken between a first voltage, i.e., the first clamping voltage, and a second lower voltage. For this purpose, depletion layer elements are inserted between the resonant circuit terminals and a reference or ground potential. For example, a lower clamping voltage is realized when the forward voltage drops across the depletion layer elements, whereby in a first approximation, the voltage drop is independent of the current due to the exponential dependence of the current on the voltage.

As a result, the depletion layer elements act as a reliable limitation of the resonant circuit voltage to a corresponding value, even at high coil currents. This is of particular importance in systems with high-quality inductors, which at close spatial proximity of the transmitting resonant circuit and the receiving resonant circuit could otherwise cause undesirably high voltages.

The upper clamping voltage can be realized by a Zener diode, connected in series, with a reversed forward direction that can be short-circuited in a controlled or connected manner. In the short-circuit mode, the described limitation occurs to the lower clamping voltage, whereas in a non-short-circuit mode, the breakdown voltage of the Zener diode provides an additional voltage offset, which in sum with the aforementioned forward voltages defines an upper clamping voltage. In a mode when the Zener diode is short-circuited, a comparatively large current emerges from the receiving resonant circuit, which corresponds to the loaded mode of the resonant circuit. The current drain from the resonant circuit as well as the demand on the resonant circuit by opening the short circuit via the Zener diode is decreased accordingly.

A problem has been observed with the load modulation from conventional circuits, which is, when during the activation of modulation, that is, when the resonant circuit voltage is limited to the lower clamping voltage, a high coil current is induced, the current drains typically through a bridging of Zener diodes and the remaining depletion layer elements that are switched in a forward direction, whereby the resonant circuit voltage can fall below the lower clamping voltage and even below a threshold value that is used for detecting oscillations (pulses) of the resonant circuit voltage. With unfavorable phase conditions, therefore, it can happen that when the load is turned on, the voltage of the transmitting resonant circuit drops below a detection threshold for one or several periods due to feedback, which corrupts the information transmission. This can cause data loss during information transmission to the reading device.

If, during a high-induced coil current, the modulation is turned on, the depletion layer elements assure a limitation of the resonant current voltage to a value predetermined by the depletion layer elements. In this phase, the diodes function like a direct-current source and thus do not attenuate the coil current sufficiently so that the induced oscillation is altered. This results in a widening of the directly adjacent clock pulse phase (pulse widening), which leads at least to a partial cancellation of the sequential oscillation. This is manifested in that at least one oscillation in the amplitude is too small for a preset detection threshold.

SUMMARY OF THE INVENTION

It is therefore an object of the present invention to provide a method and a circuit arrangement that eliminates the aforementioned disadvantage.

This object is achieved by a method of the aforementioned type in that the voltage limitation in a transponder with a first transmitting and receiving resonant circuit, which is connected to a second transmitting and receiving resonant circuit of a base station by means of an electromagnetic coupling and which has a first resonant circuit terminal, which is connected to the input of a controllable depletion layer element and a second resonant circuit terminal, which is connected to the output of the controllable depletion layer element, occurs in such a way that for voltage limitation in the transmitting and receiving resonant circuit, the control terminal of the depletion layer element is driven by the voltage of the first and second terminal.

This method offers the advantage that for both voltage half-waves overall only one depletion layer component needs to be provided, whereas in prior-art methods a symmetric construction of at least one depletion layer component was provided per voltage half-wave.

A limitation of the voltage can occur from a first to a second voltage value for load modulation.

The voltage limitation and the load modulation can occur by activation of the same depletion layer element. This simplifies the method considerably.

An embodiment provides that the change from the first to a second voltage occurs in at least two steps in that at least two depletion layer elements are bridged to reduce the voltage to the second, low value in a cascading manner, therefore one after another. As a result, the coil current which would have flowed abruptly when the modulation transistor was turned on is distributed over several oscillations. In this case, the coil voltage also declines to the level of the second voltage over several oscillations.

According to another embodiment, the change from the first to a second voltage can occur linearly in that this is regulated by an inverse signal.

Furthermore, the object is achieved by a circuit for voltage limitation in a transponder, which comprises a resonant circuit, at least one inductor, a capacitor, a depletion layer component with an input, output, and a control input, as well as a first resonant circuit terminal, which is connected to the input of the depletion layer element and a second resonant circuit terminal, which is connected to the output of the depletion layer element, whereby there is a connection between the control input of the depletion layer component and the first resonant circuit terminal and the second resonant circuit terminal.

A circuit in which an NMOS transistor is provided as the depletion layer component can be especially advantageous here.

At least two bridgeable depletion layer components, connected in series, can be provided to drive the depletion layer component.

In another embodiment, switches, driven by time-staggered modulation signals, can be provided for bridging the depletion layer components connected in series.

According to another embodiment, before the depletion layer components connected in series, a polarity change circuit with two parallel-connected depletion layer components with opposite directions can be provided.

In an alternative circuit, a PMOS transistor can be provided as the depletion layer component.

It is especially advantageous here when a capacitor switchable by an inverse modulation signal is provided for driving the depletion layer component.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
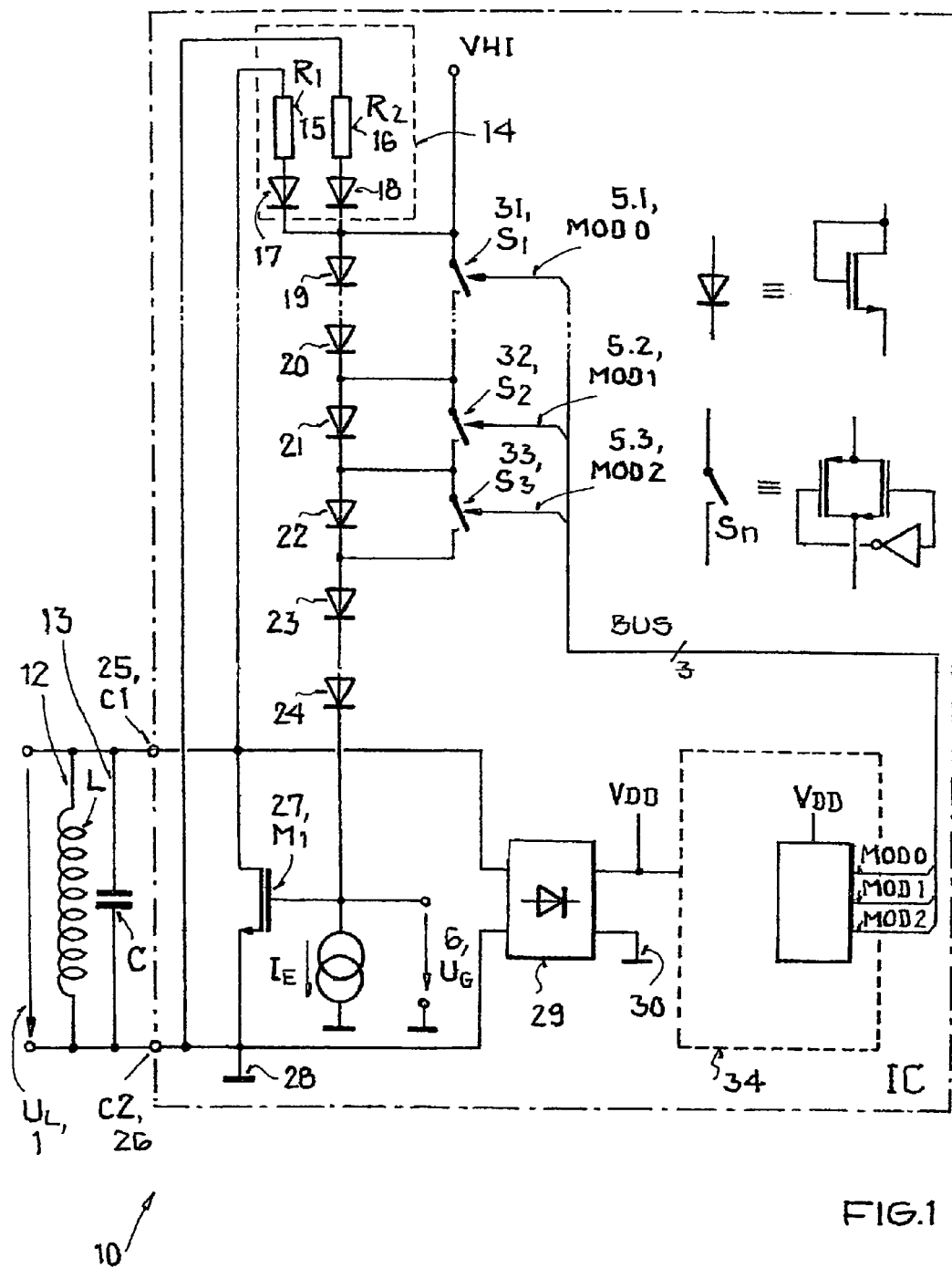
FIG. 1 illustrates a transmitting and receiving resonant circuit with elements for load modulation for a first voltage half-wave.
Figure 2:
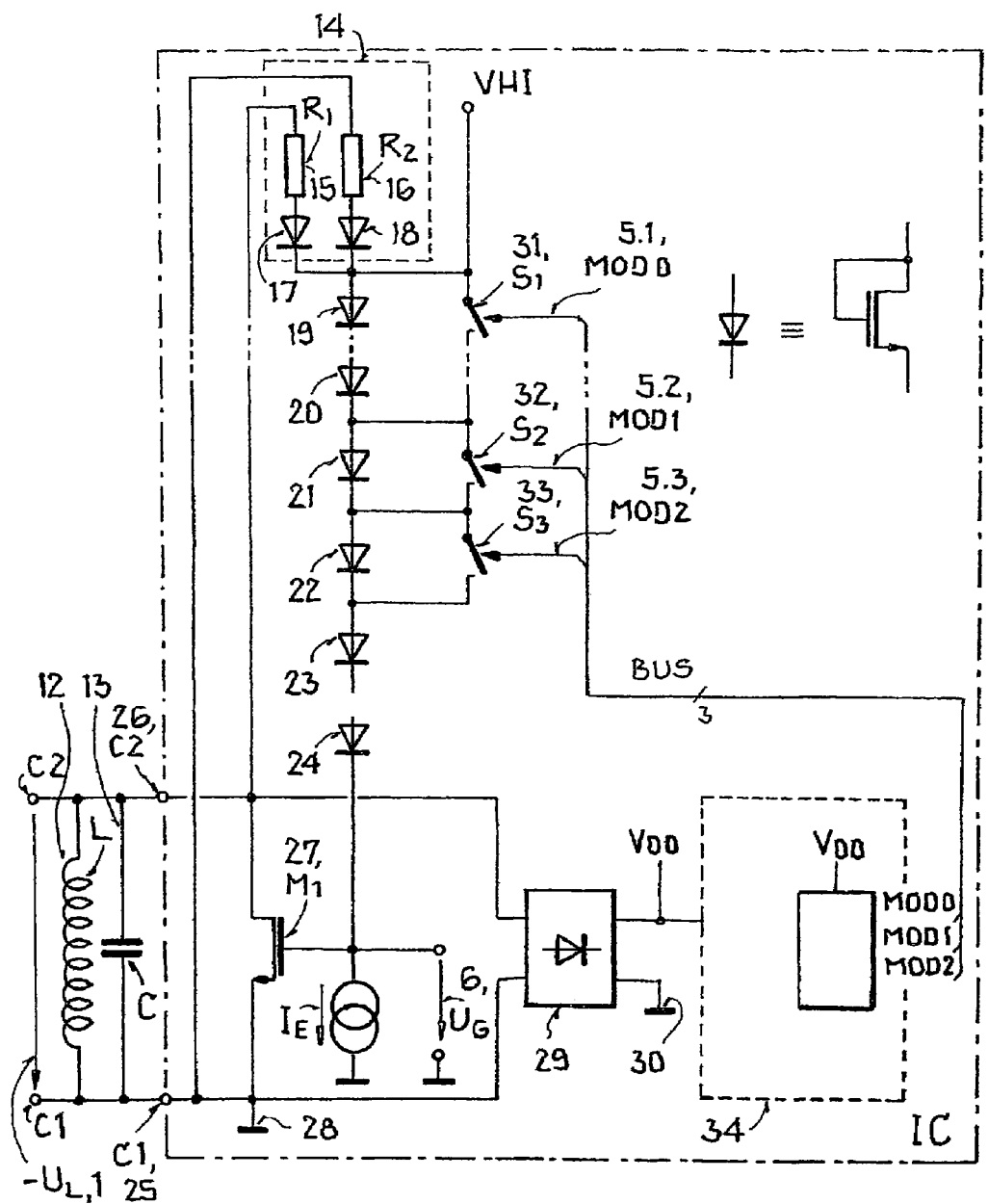
FIG. 2 illustrates the transmitting and receiving resonant circuit of FIG. 1 with elements for load modulation for a second voltage half-wave.

FIGS. 1 and 2 show a transmitting and receiving resonant circuit 10 of a receiving part or tag. Parallel to resonant circuit 10, which comprises an inductor L 12 and a capacitor C 13, a depletion layer component 27, such as an NMOS transistor is located between a first resonant circuit terminal $C_1$ 25 and a second resonant circuit terminal $C_2$ 26. At the output of depletion layer component 27, there is a reference potential terminal 28 which represents a ground potential for the circuit. Because depletion layer component 27 can switch between source and drain, the circuit in the present form can be used both for a first and for a second voltage half-wave.

Parallel to resonant circuit 10 and between the first $C_1$ 25 and second resonant circuit terminal $C_2$ 26, there is a series connection comprising polarity change circuit 14 and diodes 19, 20, 21, 22, 23, 24, which are used to drive depletion layer component 27. In this case, the diodes can be realized as NMOS transistors, which are connected as diodes. Parallel to depletion layer component 27, furthermore, there is a rectifier circuit 29 with another reference potential terminal 30.

Polarity change circuit 14 consists of two parallel series connections, each of which comprise an ohmic resistor $R_1$ 15 or $R_2$ 16 and a diode 17 or 18, whereby the flow direction of diodes 17, 18 is different.

Diodes 19 through 24 can be bridged by switches $S_1$ 31, $S_2$ 32, $S_3$ 33, which are actuated by control circuit 34 via cascading MOD signals $MOD_0$, $MOD_1$, and $MOD_2$. Switches 31, 32, 33 are realized preferably as transistors, particularly as MOS transistors.

Depletion layer component 27 is used initially to limit the resonant circuit voltage $U_L$ 1 between the terminals 25 and 26 of transmitting and receiving resonant circuit 10 with open switches 31, 32, and 33. In this mode, depletion layer component 27 limits when the potential difference between the reference potential terminal 28, 30 and one of the terminals 25 or 26 exceeds the forward voltage of the depletion layer component 27. This value defines the upper limiting voltage or the first clamping voltage $U_{KL}$ 2.2.

During bridging of the diodes 19 through 24 by switches 31, 32, and 33, whereby for step-wise modulation of the voltage said switches are closed one after another and not at the same time, depletion layer component 27 clamps the resonant circuit voltage $U_L$ 1 to a lower value $UL_{MOD}$ 2.1.

By opening and closing switches 31, 32, 33, control circuit 34 modulates the value of resonant circuit voltage $U_L$ 1 according to the data sequence to be transmitted. As described, this modulation of transmitting and receiving resonant circuit 10 of the tag forms as a modulation of the load of the transmitting and receiving resonant circuit of the reading device with the requirement of the transformer coupling.

Figure 3:
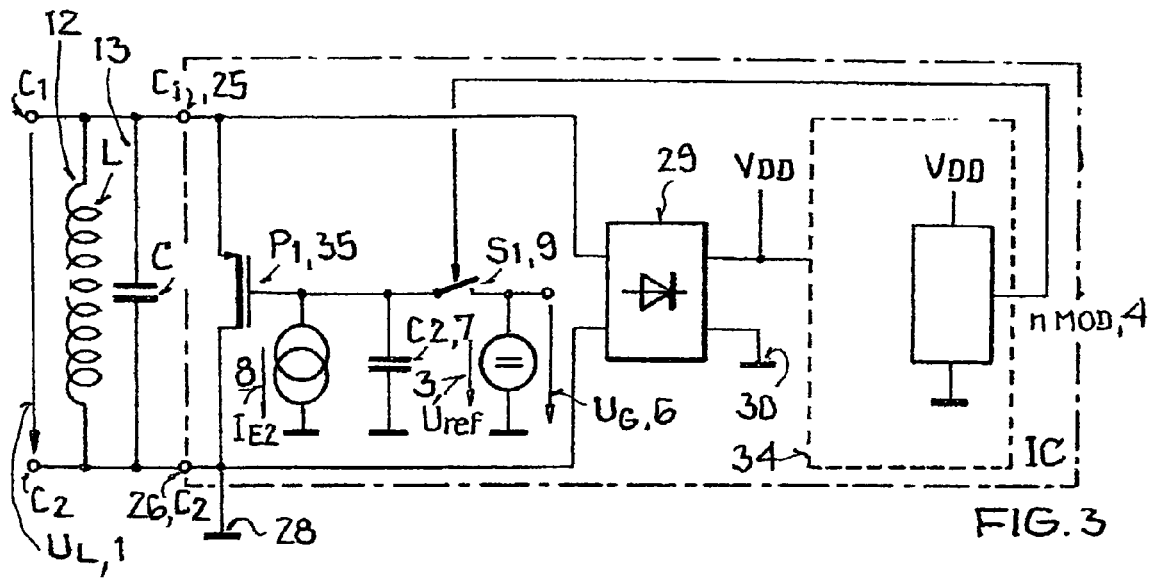
FIG. 3 illustrates another transmitting and receiving resonant circuit with elements for load modulation for a first voltage half-wave.
Figure 4:
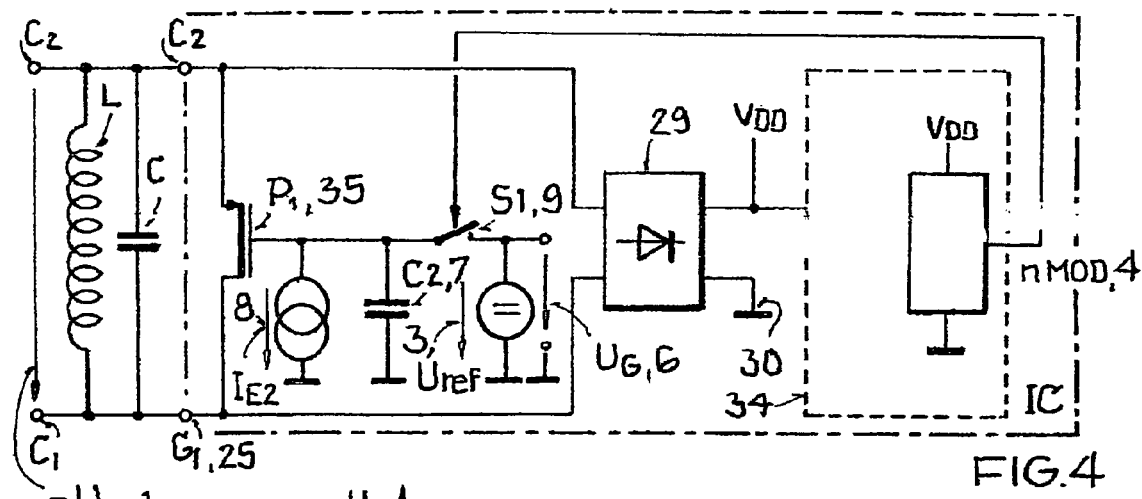
FIG. 4 illustrates the transmitting and receiving resonant circuit of FIG. 3 with elements for load modulation for a second voltage half-wave.

FIGS. 3 and 4 show another transmitting and receiving resonant circuit 10 of a receiving part or tag. Here, FIG. 3 shows a circuit for a first voltage half-wave and FIG. 4 the circuit of FIG. 3 for a second voltage half-wave. Parallel to resonant circuit 10, which comprises an inductor L 12 and a capacitor C 13, a depletion layer component 35, preferably a PMOS transistor, is located between a first resonant circuit terminal $C_1$ 25 and a second resonant circuit terminal $C_2$ 26. At the output of depletion layer component 35, there is a reference potential terminal 28 which represents a ground potential for the circuit. A current source $I_E$, which in turn makes available a discharge current for discharging a parallel-connected capacitor 7, and a voltage source $U_{ref}$ 3 are used to drive depletion layer component 35. In this case, a switch $S_1$ 9, which is actuated by an inverse signal nMOD 4, is disposed between capacitor 7 and voltage source $U_{ref}$ 3.

Depletion layer component 35 is used to limit resonant circuit voltage $U_L$ 1 to the value of the upper clamping voltage $U_{KL}$ 2.2 between terminals 25 and 26 of transmitting and receiving resonant circuit 10. When switch $S_1$ 9 is closed, the voltage $U_{ref}$ 3, which is limited by the predetermined voltage $U_G$ 6 at the gate and thereby cannot go beyond the threshold voltage of the PMOS transistor, is applied at depletion layer component 35. As soon as switch $S_1$ 9 is opened by the nMOD 4 signal of control circuit 34, capacitor 7 is charged to the value $U_{ref}$ 3 and then discharged by means of the discharge current of current source $I_{E2}$ 8. The result is that the voltage $U_G$ 6 at the gate declines linearly to zero. By this means, resonant circuit voltage $U_L$ 1 is limited to a second smaller clamping voltage $U_{LMOD}$ 2.1, which corresponds to the threshold voltage of the DMOS transistor.

Figure 5:
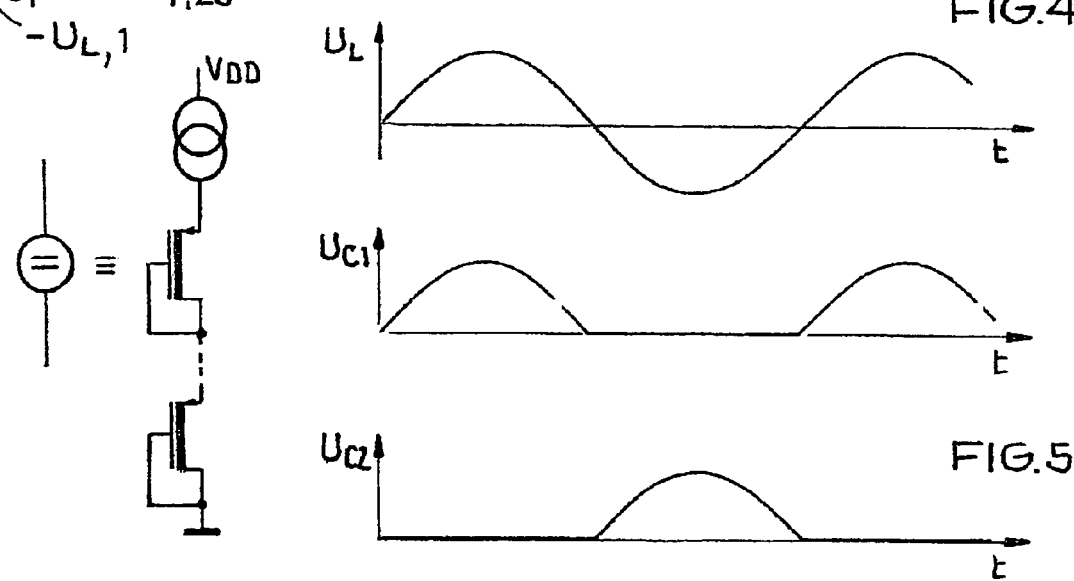
FIG. 5 illustrates the course of resonant circuit voltages $U_L$, $U_{C1}$, $U_{C2}$.

FIG. 5 shows the course of the resonant circuit voltage $U_L$ 1 and the course of the specific voltage half-waves $U_{C1}$ and $U_{C2}$ at the two resonant circuit terminals $C_1$ 25 and $C_2$ 26. The resonant circuit voltage $U_L$ 1 arises as the difference of the voltage values at the terminals. $U_L = U_{C1} - U_{C2}$. When $U_L$ 1 is positive, in the circuit according to FIG. 1 and FIG. 3, resonant circuit terminal $C_2$ is connected via rectifier 29 to an internal ground 30. In the opposite case, when $U_L$ 1 is negative, according to the diagram in FIG. 2 and FIG. 4, resonant circuit terminal $C_1$ 26 is connected to the internal ground 30.

Figure 6:
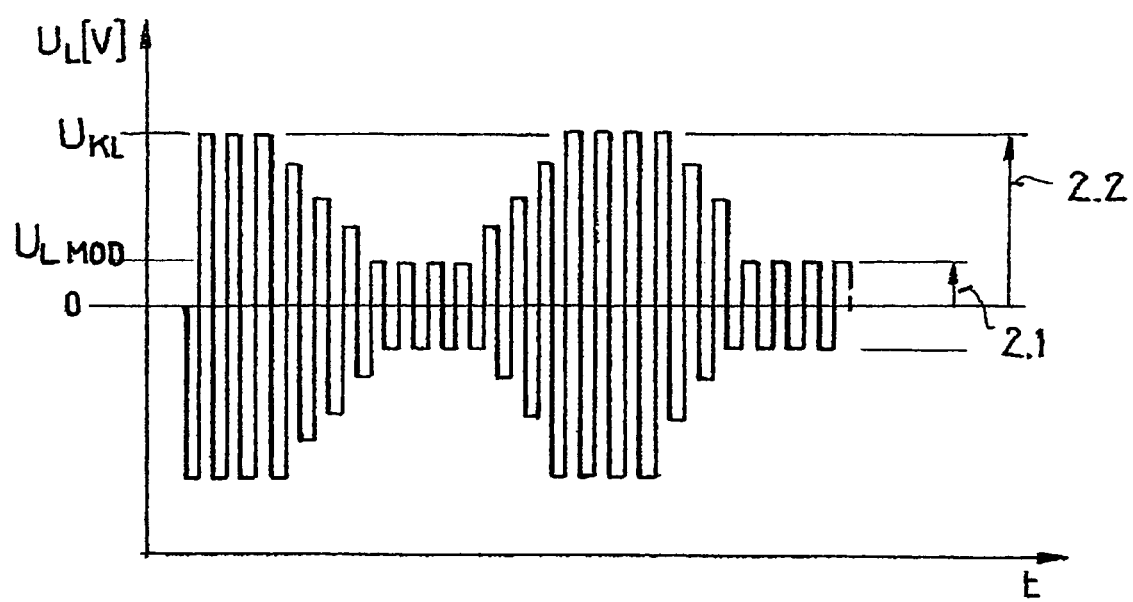
FIG. 6 illustrates a desired modulation behavior.

FIG. 6 shows a desired curve of the resulting resonant circuit voltage $U_L$ in the receiving resonant circuit under the influence of a controlled load modulation according to the present invention over the time t. The large amplitudes 2.2 arise with open switches 31, 32, 33 according to FIG. 1 and FIG. 2 and the small amplitudes 2.1 arise with closed switches 31, 32, 33 with which diodes 19, 20, 21, 22 are bridged.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for voltage limitation in a transponder, the method comprising:
    providing a first transmitting and receiving resonant circuit that includes a first resonant circuit terminal, which is connectable to an input of a controllable depletion layer element, and a second resonant circuit terminal, which is connectable to an output of the controllable depletion layer element; and
    limiting the voltage in the transmitting and receiving resonant circuit by driving a control terminal of the controllable depletion layer element by a voltage of the first and second resonant circuit terminal.

2. The method according to claim 1, wherein the limitation of the voltage occurs from a first to a second voltage value for load modulation.

3. The method according to claim 2, wherein the voltage limitation and the load modulation occur by activation of the same depletion layer element.

4. The method according to claim 2, wherein the change from a first to a second voltage occurs in at least two steps, and wherein at least two depletion layer elements are bridged one after another to reduce the voltage to a second low value.

5. The method according to claim 3, wherein the change from the first to a second voltage occurs linearly through regulation of an inverse signal.

6. A circuit for voltage limitation in a transponder, the circuit having a resonant circuit comprising:
    at least one inductor;
    a capacitor;
    a depletion layer component having an input an output, and a control input;
    a first resonant circuit terminal that is connected to the input of the depletion layer element; and
    a second resonant circuit terminal that is connected to the output of the depletion layer element;
    wherein an electrical connection is formed between the control input of the depletion layer component and the first resonant circuit terminal and the second resonant circuit terminal.

7. The circuit according to claim 6, wherein the depletion layer component is an NMOS transistor.

8. The circuit according to claim 6, wherein at least two bridgeable depletion layer components, which are connected in series, are provided to drive the depletion layer component.

9. The circuit according to claim 6, wherein switches that are driven by time-staggered modulation signals are provided for bridging the depletion layer components that are connected in series.

10. The circuit according to claim 6, wherein a polarity change circuit with two parallel-connected depletion layer components with opposite forward directions is provided.

11. The circuit according to claim 6, wherein the depletion layer component is a PMOS transistor.

12. The circuit according to claim 6, wherein a capacitor that is switchable via a modulation signal is provided for driving the depletion layer component.

* * * * *